US012701874B2

(12) United States Patent
    Cai

(10) Patent No.:    US 12,701,874 B2
(45) Date of Patent:        Aug. 4, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Huatang Cai, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 463 days.

(21) Appl. No.: 17/771,543

(22) PCT Filed: Apr. 15, 2022

(86) PCT No.: PCT/CN2022/087056
    § 371 (c)(1),
    (2) Date: Apr. 25, 2022

(87) PCT Pub. No.: WO2023/184594
    PCT Pub. Date: Oct. 5, 2023

(65)            Prior Publication Data
    US 2023/0320144 A1      Oct. 5, 2023

(30)        Foreign Application Priority Data
    Mar. 29, 2022    (CN) .......................... 202210322418.9

(51) Int. Cl.
    *H10K 59/80*        (2023.01)
    *H10K 59/126*       (2023.01)
                (Continued)

(52) U.S. Cl.
    CPC ..... *H10K 59/126* (2023.02); *H10K 59/80521* (2023.02); *H10D 86/441* (2025.01); *H10D 86/60* (2025.01); *H10K 59/1213* (2023.02)

(58) Field of Classification Search
    CPC .............. H10K 59/126; H10K 50/822; H10K 59/80521; H10K 59/1213; H10K 59/00; H01L 27/124; H10D 86/60; H10D 86/441
    See application file for complete search history.

(56)            References Cited

U.S. PATENT DOCUMENTS

10,884,282 B1    1/2021  Meng et al.
    2011/0284898 A1*  11/2011  Iwasaki .................. H10K 59/38
                                                257/98
                (Continued)

FOREIGN PATENT DOCUMENTS

CN      105807969 A      7/2016
    CN      106886341 A      6/2017
                (Continued)

OTHER PUBLICATIONS

Chinese Office Action issued in corresponding Chinese Patent Application No. 202210322418.9 dated May 25, 2023, pp. 1-6, 14pp.
                (Continued)

*Primary Examiner* — Matthew C Landau
*Assistant Examiner* — David W Ward
(74) *Attorney, Agent, or Firm* — The Roy Gross Law Firm, LLC; Roy D. Gross

(57)            ABSTRACT

A display panel and a display device are disposed. The display panel includes a first substrate, a first light shielding layer, a second light shielding layer, a first electrode layer, a light emitting layer, and a second electrode layer. The second electrode layer is provided with a light transmitting opening in the first display area. The first light shielding
                (Continued)

layer and the second light shielding layer are respectively provided with a first opening and a second opening corresponding to the light transmitting opening in the first display area. This prevents a part of the second electrode layer corresponding to first sub-pixels from being lasered away and improves a laser precision.

16 Claims, 5 Drawing Sheets

(51) Int. Cl.
        *H10D 86/40*            (2025.01)
        *H10D 86/60*            (2025.01)
        *H10K 59/121*          (2023.01)

(56)                    References Cited

U.S. PATENT DOCUMENTS

| 2015/0340660 A1* | 11/2015 | Wada | H10K 59/80517 257/40 |
| 2016/0049615 A1* | 2/2016 | Kim | H10K 59/122 257/40 |
| 2019/0115410 A1* | 4/2019 | Zhu | H10K 59/131 |
| 2020/0026899 A1* | 1/2020 | Sun | G06V 40/1318 |
| 2020/0266301 A1* | 8/2020 | Cai | H10D 30/6723 |
| 2020/0285826 A1* | 9/2020 | Gu | G06V 40/1318 |
| 2021/0167156 A1* | 6/2021 | Sun | H10D 30/6723 |
| 2021/0408194 A1* | 12/2021 | Zhang | H10K 59/126 |
| 2022/0069028 A1* | 3/2022 | Jang | H10K 59/121 |
| 2022/0344432 A1* | 10/2022 | Shi | H10K 59/121 |
| 2023/0189559 A1* | 6/2023 | Lee | H10K 59/8792 257/40 |
| 2024/0032355 A1* | 1/2024 | Ding | H10K 59/124 |
| 2024/0040894 A1* | 2/2024 | Jin | H10K 59/80521 |
| 2024/0099084 A1* | 3/2024 | Liu | H10K 59/121 |

FOREIGN PATENT DOCUMENTS

| CN | 111708195 A | 9/2020 |
| CN | 111710707 A | 9/2020 |
| CN | 112379794 A | 2/2021 |
| CN | 112488086 A | 3/2021 |
| CN | 112530343 A | 3/2021 |
| CN | 112713178 A | 4/2021 |
| CN | 113113454 A | 7/2021 |
| CN | 113284911 A | 8/2021 |
| CN | 113299859 A | 8/2021 |
| CN | 113394245 A | 9/2021 |
| JP | 2005134934 A | 5/2005 |

OTHER PUBLICATIONS

PCT International Search Report for International Application No. PCT/CN2022/087056, mailed on Nov. 30, 2022, 10pp.
PCT Written Opinion of the International Search Authority for International Application No. PCT/CN2022/087056, mailed on Nov. 30, 2022, 11pp.

* cited by examiner

DISPLAY PANEL AND DISPLAY DEVICE

CROSS REFERENCE TO RELATED APPLICATIONS

This application is a National Phase of PCT Patent Application No. PCT/CN2022/087056 having International filing date of Apr. 15, 2022, which claims the benefit of priority of Chinese Patent Application No. 202210322418.9, filed Mar. 29, 2022, the contents of which are all incorporated herein by reference in their entirety.

FIELD OF THE DISCLOSURE

The present application relates to the field of display technologies, and more particularly, to a display panel and a display device.

BACKGROUND

For AMOLED (active-matrix organic light-emitting diode) display panels, how to improve a light transmittance of a photosensitive area of the display panel has always been a difficult issue. One way currently adopted is to adopt a patterned design of a cathode layer in the photosensitive area. The photosensitive area includes a pixel area and a light transmitting area. The pixel area is used to set light emitting pixels, and the light transmitting area is used to transmit light. The cathode layer located in the light transmitting area is removed by an infrared laser to improve a light transmittance of the light transmitting area. When an infrared laser is irradiated from a back of the display panel to the photosensitive area, film layers below the cathode layer hardly absorb the infrared laser. This causes not only a portion of the cathode layer located in the light transmitting area to be lasered off, but also a portion of the cathode layer located in the pixel area to be lasered off. This affects a normal display of the photosensitive area.

SUMMARY

Technical Problem

Embodiments of the present application provide a display panel and a display device, so as to solve an issue that when an infrared laser is irradiated to a photosensitive area from a back of the display panel, a cathode layer located in a light transmitting area and a pixel area is lasered off, which affects the technical problem of a normal display of the photosensitive area.

Technical Solution

In order to solve the above-mentioned issues, technical solutions provided by the present application are as follows:

The present application provides a display panel comprising a first display area and a second display area, wherein a light transmittance of the first display area is greater than a light transmittance of the second display area, the display panel comprises:

a first substrate;

a first light shielding layer disposed on a side of the first substrate;

a second light shielding layer disposed on a side of the first light shielding layer away from the first substrate;

a first electrode layer disposed on a side of the second light shielding layer away from the first substrate;

a light emitting layer disposed on a side of the first electrode layer away from the first substrate, wherein the light emitting layer comprises a plurality of first sub-pixels disposed in the first display area and a plurality of second sub-pixels disposed in the second display area; and a second electrode layer disposed on a side of the light emitting layer away from the first substrate, wherein the second electrode layer is provided with a light transmitting opening between at least part of the first sub-pixels adjacent to the first display area;

wherein the first light shielding layer is provided with a first opening corresponding to the light transmitting opening in the first display area, and the second light shielding layer is provided with a second opening corresponding to the light transmitting opening in the first display area.

According to the display panel provided by the present application, an orthographic projection of the first opening on the first substrate is located within an orthographic projection of the light transmitting opening on the first substrate; and an orthographic projection of the second opening on the first substrate is located within the orthographic projection of the light transmitting opening on the first substrate.

According to the display panel provided by the present application, the first light shielding layer comprises:

first shielding sub-sections corresponding to the first sub-pixels;

third shielding sub-sections disposed around the first shielding sub-sections;

second shielding sub-sections connecting two adjacent ones of the first shielding sub-sections or connecting adjacent ones of the first shielding sub-sections and the third shielding sub-sections;

wherein the first light shielding layer located in the first display area corresponds to an area surrounded by the adjacent ones of the first shielding sub-sections and the second shielding sub-sections, and/or the first opening is provided corresponding to an area surrounded by the adjacent ones of the first shielding sub-sections, the second shielding sub-sections, and the third shielding sub-sections.

According to the display panel provided by the present application, the second light shielding layer covers at least edge portions of the first shielding sub-sections, the second shielding sub-sections, and the third shielding sub-sections surrounding the first opening.

According to the display panel provided by the present application, a distance between an orthographic projection of one of the first shielding sub-sections on the first substrate and an orthographic projection of the first electrode layer on the first substrate ranges from 0.5 micrometers to 1.5 micrometers.

According to the display panel provided by the present application, the first display area comprises a display light transmitting area and a display transition area disposed between the display light transmitting area and the second display area, and the third shielding sub-sections are disposed corresponding to an edge of the display light transmitting area.

According to the display panel provided by the present application, the display panel further comprises:

a driving circuit layer disposed between the first light shielding layer and the first electrode layer, wherein the driving circuit layer comprises:

a semiconductor layer, a first insulating layer disposed on a side of the semiconductor layer away from the first substrate;

a first gate metal layer disposed on a side of the first insulating layer away from the first substrate;

a second insulating layer disposed on a side of the first gate metal layer away from the first substrate;

a second gate metal layer disposed on a side of the second insulating layer away from the first substrate;

a third insulating layer disposed on a side of the second gate metal layer away from the first substrate; and a source and drain metal layer disposed on a side of the third insulating layer away from the first substrate;

wherein the second light shielding layer and the first gate metal layer are disposed in a same layer, the second light shielding layer and the second gate metal layer are disposed in a same layer, or the second light shielding layer and the source and drain metal layer are disposed in a same layer.

The present application provides a display panel comprising a first display area and a second display area, wherein the display panel comprises:

a first substrate;

a first light shielding layer disposed on a side of the first substrate;

a second light shielding layer disposed on a side of the first light shielding layer away from the first substrate;

a first electrode layer disposed on a side of the second light shielding layer away from the first substrate;

a light emitting layer disposed on a side of the first electrode layer away from the first substrate, wherein the light emitting layer comprises a plurality of first sub-pixels disposed in the first display area and a plurality of second sub-pixels disposed in the second display area; and a second electrode layer disposed on a side of the light emitting layer away from the first substrate, wherein the second electrode layer is provided with a light transmitting opening between at least part of the first sub-pixels adjacent to the first display area;

wherein the first light shielding layer is provided with a first opening corresponding to the light transmitting opening in the first display area, and the second light shielding layer is provided with a second opening corresponding to the light transmitting opening in the first display area.

According to the display panel provided by the present application, an orthographic projection of the first opening on the first substrate is located within an orthographic projection of the light transmitting opening on the first substrate; and an orthographic projection of the second opening on the first substrate is located within the orthographic projection of the light transmitting opening on the first substrate.

According to the display panel provided by the present application, the first light shielding layer comprises:

first shielding sub-sections corresponding to the first sub-pixels;

third shielding sub-sections disposed around the first shielding sub-sections;

second shielding sub-sections connecting two adjacent ones of the first shielding sub-sections or connecting adjacent ones of the first shielding sub-sections and the third shielding sub-sections;

wherein the first light shielding layer located in the first display area corresponds to an area surrounded by the adjacent ones of the first shielding sub-sections and the second shielding sub-sections, and/or the first opening is provided corresponding to an area surrounded by the adjacent ones of the first shielding sub-sections, the second shielding sub-sections, and the third shielding sub-sections.

According to the display panel provided by the present application, the second light shielding layer covers at least edge portions of the first shielding sub-sections, the second shielding sub-sections, and the third shielding sub-sections surrounding the first opening.

According to the display panel provided by the present application, a distance between an orthographic projection of one of the first shielding sub-sections on the first substrate and an orthographic projection of the first electrode layer on the first substrate ranges from 0.5 micrometers to 1.5 micrometers.

According to the display panel provided by the present application, the first display area comprises a display light transmitting area and a display transition area disposed between the display light transmitting area and the second display area, and the third shielding sub-sections are disposed corresponding to an edge of the display light transmitting area.

According to the display panel provided by the present application, the display panel further comprises:

a driving circuit layer disposed between the first light shielding layer and the first electrode layer, wherein the driving circuit layer comprises:

a semiconductor layer, a first insulating layer disposed on a side of the semiconductor layer away from the first substrate;

a first gate metal layer disposed on a side of the first insulating layer away from the first substrate;

a second insulating layer disposed on a side of the first gate metal layer away from the first substrate;

a second gate metal layer disposed on a side of the second insulating layer away from the first substrate;

a third insulating layer disposed on a side of the second gate metal layer away from the first substrate; and a source and drain metal layer disposed on a side of the third insulating layer away from the first substrate;

wherein the second light shielding layer and the first gate metal layer are disposed in a same layer, the second light shielding layer and the second gate metal layer are disposed in a same layer, or the second light shielding layer and the source and drain metal layer are disposed in a same layer.

According to the display panel provided by the present application, at least in the first display area, a surface of the second light shielding layer close to a side of the first substrate is in direct contact with a surface of the first light shielding layer away from the side of the first substrate.

According to the display panel provided by the present application, a thickness of the first light shielding layer ranges from 500 angstroms to 5000 angstroms, and a total thickness of the first light shielding layer and the second light shielding layer ranges from 1000 angstroms to 7500 angstroms.

According to the display panel provided by the present application, the display panel further comprises:

a first inorganic insulating layer disposed between the first light shielding layer and the second light shielding layer; and a driving circuit layer disposed between the second light shielding layer and the first electrode layer.

According to the display panel provided by the present application, the display panel further comprises a second substrate and a second inorganic insulating layer;

wherein the first light shielding layer is disposed on a side of the first substrate; the first inorganic insulating layer is disposed between the second substrate and the first light-shielding layer; the second light shielding layer is disposed on a side of the second substrate away from the first substrate; and the second inorganic insulating layer is disposed between the second light shielding layer and the driving circuit layer.

According to the display panel provided by the present application, a pixel density of the first display area is equal to a pixel density of the second display area.

The present application provides a display device comprising a display panel; and a photosensor disposed on a side of the display panel and located in a first display area;

wherein the display panel comprises the first display area and a second display area, and the display panel comprises:

a first substrate;

a first light shielding layer disposed on a side of the first substrate;

a second light shielding layer disposed on a side of the first light shielding layer away from the first substrate;

a first electrode layer disposed on a side of the second light shielding layer away from the first substrate;

a light emitting layer disposed on a side of the first electrode layer away from the first substrate, wherein the light emitting layer comprises a plurality of first sub-pixels disposed in the first display area and a plurality of second sub-pixels disposed in the second display area; and a second electrode layer disposed on a side of the light emitting layer away from the first substrate, wherein the second electrode layer is provided with a light transmitting opening between at least part of the first sub-pixels adjacent to the first display area;

wherein the first light shielding layer is provided with a first opening corresponding to the light transmitting opening in the first display area, and the second light shielding layer is provided with a second opening corresponding to the light transmitting opening in the first display area.

Advantageous Effect

The advantageous effects of the present application are as follows: In the display panel and the display device provided by the present application, the display panel includes a first display area and a second display area. A second light shielding layer is disposed on the basis of the first light shielding layer, the second light shielding layer is disposed on the side of the first light shielding layer away from the first substrate, and the second electrode layer is at least partially adjacent to the first light shielding layer in the first display area. Light transmitting openings are arranged between sub-pixels. The first light shielding layer is provided with a first opening in the first display area corresponding to the light transmitting opening, and the second light shielding layer is provided with a second opening in the first display area corresponding to the light transmitting opening. The arrangement of the second light shielding layer is equivalent to increasing the overall thickness of the light shielding layer, so that the area of the second electrode layer when diffracted light formed by an infrared laser at the second opening is irradiated to the second electrode layer is reduced. This avoids that a part of the second electrode layer corresponding to the first sub-pixels is also removed by laser, which is beneficial to improve a precision of laser and a light transmittance of the first display area.

BRIEF DESCRIPTION OF THE DRAWINGS

In order to illustrate the technical solutions in the embodiments of the present application more clearly, the following briefly introduces the accompanying drawings that are used in the description of the embodiments. Obviously, the drawings in the following description are only some embodiments of the present application. For those skilled in the art, other drawings can also be obtained from these drawings without creative effort.

Figure 1:
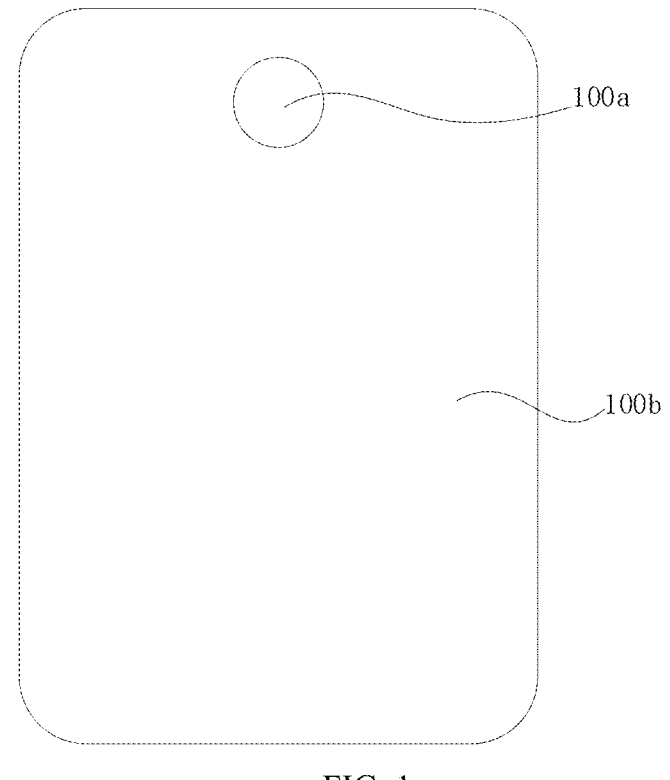
FIG. 1 is a schematic diagram of a first top-view structure of a display panel provided by an embodiment of the present application.

DESCRIPTION OF REFERENCE SIGNS 100a first display area; 1001a pixel area; 1002a light transmitting area; 100b second display area; 1003a display light transmitting area; 1004a display transition area;

101 first substrate; 102 first inorganic insulating layer; 103 second substrate; 104 second inorganic insulating layer; 105 first light shielding layer; 1051 first opening; 1052 first shielding sub-section; 1053 second shielding sub-section; 1054 third shielding sub-section; 106 second shielding layer; 1061 second opening; 107 driving circuit layer; 1071 first pixel driving circuit; 10711 semiconductor layer; 10712 first gate insulating layer; 10713 first gate metal layer; 10714 second gate insulating layer; 10715 second gate metal layer; 10716 interlayer dielectric layer; 10717 source and drain metal layer; 1072 transparent conductive layer; 1073 planarization layer; 108 first electrode layer; 1081 first electrode; 1082 second electrode; 109 light emitting layer; 1091 first sub-pixel; 1092 second sub-pixel; 110 pixel definition layer; 111 second electrode layer; 1111 light transmitting opening.

DETAILED DESCRIPTION

The technical solutions in the embodiments of the present application will be clearly and completely described below with reference to the accompanying drawings in the embodiments of the present application. Obviously, the described embodiments are only a part of the embodiments of the present application, but not all of the embodiments. Based on the embodiments in the present application, all other embodiments obtained by those skilled in the art without creative work fall within the protection scope of the present application. In addition, it should be understood that the specific embodiments described herein are only used to illustrate and explain the present application, but not to limit the present application. In the present application, unless otherwise stated, the directional words used such as "upper" and "lower" generally refer to the upper and lower sides of the device in actual use or working state, specifically the drawing direction in the accompanying drawings, and "inside" and "outside" refer to the outline of the device.

Refer to FIG. 1, which is a schematic top-view structure diagram of a display panel provided by an embodiment of the present application. The display panel provided by the embodiment of the present application includes a first display area 100*a* and a second display area 100*b*. A light transmittance of the first display area 100*a* is greater than a light transmittance of the second display area 100*b*. Both the first display area 100*a* and the second display area 100*b* can be used to display text or images. The first display area 100*a* and the second display area 100*b* can jointly display the same image, which is beneficial to realize a full-screen design. The display panel may integrate photosensors on a back of the first display area 100*a*, so as to realize underscreen integration of the photosensors.

The first display area 100*a* includes a plurality of pixel areas 1001*a* and a plurality of light transmitting areas 1002*a* located between two adjacent pixel areas 1001*a*. The pixel area 1001*a* is used to place a single light emitting pixel. The light transmitting area 1002*a* is used for light transmission. The pixel area 1001*a* and the light transmitting area 1002*a* are arranged at intervals. The plurality of pixel areas 1001*a* are arranged in an array, and the plurality of the light transmitting areas 1002*a* are arranged in an array.

Figure 2:
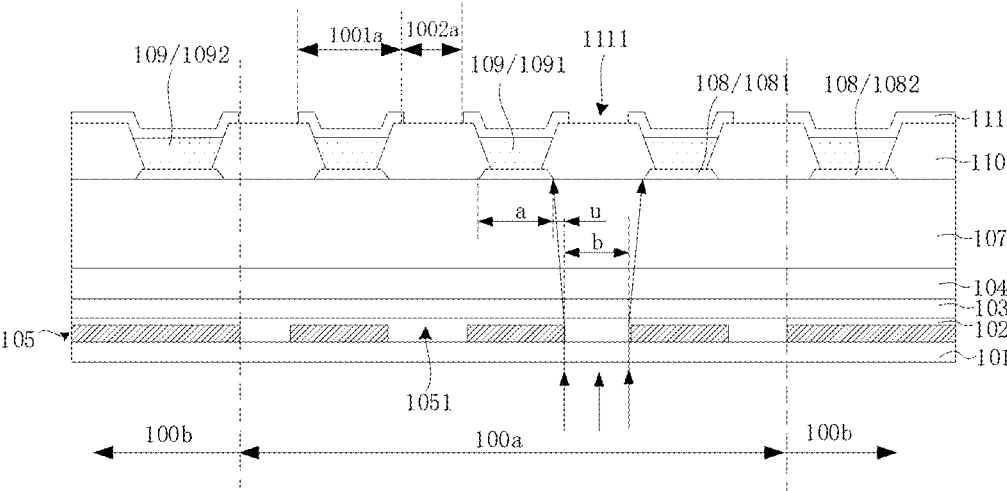
FIG. 2 is a schematic diagram of a first cross-sectional structure of a display panel provided by an embodiment of the present application.

Refer to FIG. 2, which is a schematic diagram of a first cross-sectional structure of a display panel provided by an embodiment of the present application. The display panel includes a first substrate 101, a first light shielding layer 105, a first electrode layer 108, a light emitting layer 109, and a second electrode layer 111. The first light shielding layer 105 is disposed on a side of the first substrate 101. The first electrode layer 108 is disposed on a side of the first light shielding layer 105 away from the first substrate 101. The light emitting layer 109 is disposed on a side of the first electrode layer 108 away from the first substrate 101. The light emitting layer 109 includes a plurality of first sub-pixels 1091 disposed in the first display area 100*a* and a plurality of second sub-pixels 1092 disposed in the second display area 100*b*. The second electrode layer 111 is disposed on a side of the light emitting layer 109 away from the first substrate 101. The second electrode layer 111 is provided with light transmitting openings 1111 between at least part of the first sub-pixels 1091 adjacent to each other in the first display area 100*a*. The first light shielding layer 105 is provided with a first opening 1051 in the first display area 100*a* corresponding to the light transmitting opening 1111.

Specifically, the light transmitting opening 1111 and the first opening 1051 are located in the light transmitting area 1002*a*. The first electrode layer 108 includes a plurality of first electrodes 1081 located in the first display area 100*a* and a plurality of second electrodes 1082 located in the second display area 100*b*. The plurality of first electrodes

1081 are arranged at intervals and corresponding to the plurality of first sub-pixels 1091. A plurality of the second electrodes 1082 are arranged at intervals and are arranged corresponding to the plurality of the second sub-pixels 1092. In the embodiment of the present application, the first electrode layer 108 is an anode layer, and the second electrode layer 111 is a cathode layer.

It can be understood that by setting the first light shielding layer 105 and using the first light shielding layer 105 as a mask, when infrared laser is irradiated to the first display area 100*a* from the back of the display panel, the infrared laser is irradiated to the second electrode layer 111 through the first opening 1051. The second electrode layer 111 located in the light transmitting area 1002*a* is not shielded by the first light shielding layer 105 and is lasered away by an infrared laser, thereby forming a plurality of light transmitting openings 1111. This reduces a light shielding area of the second electrode layer 111, thereby improving the light transmittance of the first display area 100*a*. The second electrode layer 111 located in the pixel area 1001*a* is shielded by the first light shielding layer 105 so as not to be removed by the infrared laser and remains. Thus, the patterning of the second electrode layer 111 is prevented from affecting a display performance of the first display area 100*a*, thereby improving an overall display performance of the display panel.

Exemplarily, a line width of the first opening 1051 is b and a line width of the first electrode 1081 is a for example for description. Due to the existence of diffracted light, an orthographic projection of the first light shielding layer 105 between two adjacent first openings 1051 on the first substrate 101 is the same as that of the first electrode 1081 on the first substrate 101. The spacing between the orthographic projections on the substrate 101 is u. A line width of the formed light transmitting opening 1111 is b+2u. In order to ensure that the first electrode 1081 does not block infrared laser light, a width of the first light shielding layer 105 between two adjacent first openings 1051 needs to be greater than or equal to a+2u. It can be understood that, the larger the u value is, the larger the width of the first light shielding layer 105 between two adjacent first openings 1051 is. Correspondingly, the smaller the area of the light transmitting area 1002*a*, the lower the transmittance of the first display area 100*a*.

In view of this, in order to maximize the light transmitting area of the first display area 100*a* and improve the light transmittance of the first display area 100*a*, it is necessary to reduce the u value as much as possible. It can be understood that because the value of u is related to the thickness of the first light shielding layer 105, the larger the thickness of the first light shielding layer 105 is, the smaller the vertical distance between the first light shielding layer 105 and the first electrode layer 108 is. The shorter the propagation distance of the diffracted light in the film layer between the first light shielding layer 105 and the first electrode layer 108 is, the smaller the u value is.

Figures 3, 4:
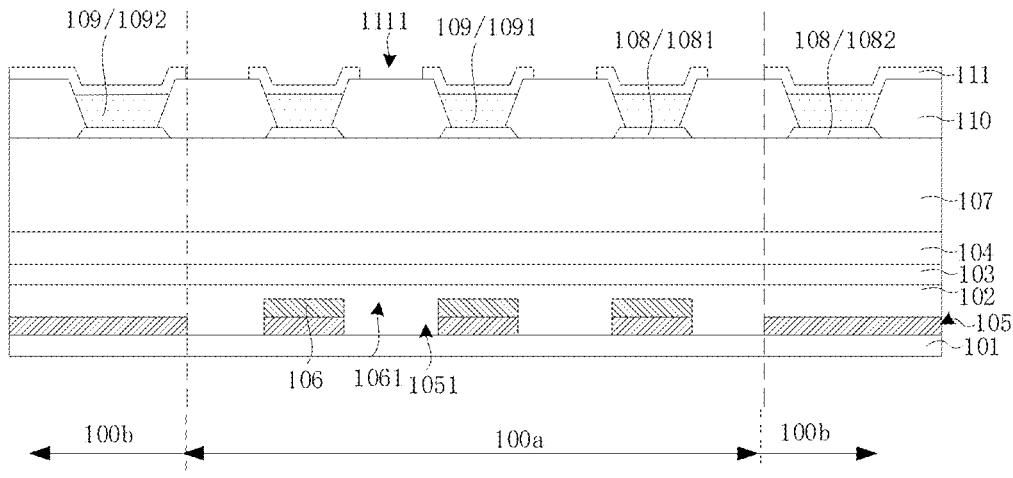
FIG. 3 is a schematic diagram of a second cross-sectional structure of a display panel provided by an embodiment of the present application.
FIG. 4 is a schematic top-view structural diagram of a first display area of a display panel provided by an embodiment of the present application.

Refer to FIG. 3, which is a schematic diagram of a second cross-sectional structure of a display panel provided by an embodiment of the present application. The first light shielding layer 105 may be thickened to reduce the influence of diffracted light. Specifically, the difference between FIG. 3 and FIG. 2 is that the display panel further includes a second light shielding layer 106. The second light shielding layer 106 is disposed on a side of the first light shielding layer 105 away from the first substrate 101. The second light shielding layer 106 is provided with a second opening 1061 in the first display area 100*a* corresponding to the light transmitting opening 1111. It can be understood that the arrangement of the second light shielding layer 106 is equivalent to increasing the overall thickness of the light shielding layer. The first light shielding layer 105 and the second light-shielding layer 106 are arranged overlappingly. The slit diffraction phenomenon occurs when the infrared laser passes through the second opening 1061. The vertical distance between the second light shielding layer 106 and the first electrode layer 108 is smaller than the vertical distance between the first light shielding layer 105 and the first electrode layer 108. This reduces the area of the second electrode layer 111 irradiated by diffracted light, thereby preventing part of the second electrode layer 111 in the pixel region 1001a from being lasered away due to diffracted light. This is beneficial to improve the precision of the laser beam and the light transmittance of the first display area 100a.

Specifically, in the embodiment of the present application, the orthographic projection of the first opening 1051 on the first substrate 101 is located within the orthographic projection of the light transmitting opening 1111 on the first substrate 101. The orthographic projection of the second opening 1061 on the first substrate 101 is located within the orthographic projection of the light transmitting opening 1111 on the first substrate 101. That is, the planar size of the first opening 1051 and the second opening 1061 is smaller than the planar size of the light transmitting opening 1111. This further reduces the risk of the diffracted light formed by the infrared laser at the second opening 1061 irradiating the second electrode layer 111 located in the pixel area 1001a, which is beneficial to further improve the precision of the laser.

Further, the orthographic projection of the first light shielding layer 105 on the first substrate 101 covers the orthographic projection of the first electrode layer 108 on the first substrate 101. On the one hand, it is to ensure that the infrared laser is not irradiated to the first electrode layer 108, so as to prevent the first electrode layer 108 from being lasered off, which affects the display performance of the first display area 100a. On the other hand, it is ensured that the infrared laser will not be irradiated to the pixel area 1001a, so as to prevent the second electrode layer 111 of the pixel area 1001a from being also lasered away, which will affect the display performance of the first display area 100a.

Optionally, a material of the first light shielding layer 105 includes any one of aluminum Al, platinum Pt, palladium Pd, anion Ag, molybdenum Mo, lithium Li, and tungsten W. A material of the second light shielding layer 106 includes any one of aluminum Al, platinum Pt, palladium Pd, anion Ag, molybdenum Mo, lithium Li, and tungsten W. The materials of the first light shielding layer 105 and the second light shielding layer 106 may be the same or different, which are not limited in this application.

Further, refer to FIG. 4, which is a schematic top-view structure diagram of a first display area of a display panel provided by an embodiment of the present application. The first light shielding layer 105 includes a first shielding sub-section 1052, a second shielding sub-section 1053, and a third shielding sub-section 1054. The first shielding sub-section 1052 is disposed corresponding to the first sub-pixel 1091. The third shielding sub-section 1054 is disposed around the first shielding sub-section 1052. The second shielding sub-sections 1053 connect two adjacent first shielding sub-sections 1052 or connect the adjacent first shielding sub-sections 1052 and the third shielding sub-sections 1054. The first light shielding layer 105 is provided with the first opening 1051 in the first display area 100a, corresponding to the area surrounded by the adjacent first shielding sub-sections 1052 and the second shielding sub-sections 1053, and/or corresponding to the area surrounded by the adjacent first shielding sub-sections 1052, the second shielding sub-sections 1053, and the third shielding sub-sections 1054.

Specifically, the distance between the orthographic projection of the first shielding subsection 1052 on the first substrate 101 and the orthographic projection of the first electrode layer 108 on the first substrate 101 ranges from 0.5 microns to 1.5 microns.

Further, the second electrode layer 111 further includes a plurality of first electrode subsections, second electrode sub-sections, and third electrode sub-sections. The first electrode sub-sections are disposed corresponding to the first sub-pixels 1091. The third electrode sub-sections are disposed around the first electrode sub-sections. The second electrode sub-sections connect two adjacent first electrode sub-sections or connect adjacent first electrode sub-sections and the third electrode sub-sections. The second electrode layer is provided with the light transmitting opening 1111 in the first display area 100a corresponding to the area surrounded by the adjacent first electrode sub-sections and the second electrode sub-sections.

Specifically, the first electrode sub-sections are arranged corresponding to the first shielding sub-sections 1052. The second electrode sub-sections are arranged corresponding to the second shielding sub-sections 1053. The third electrode sub-sections are arranged corresponding to the third shielding sub-sections 1054. Both the third electrode sub-section and the third shielding sub-section 1054 are serpentine traces. The orthographic projection of the third shielding sub-section 1054 on the first substrate 101 covers the orthographic projection of the third electrode sub-section on the first substrate 101.

In the embodiment of the present application, in order to ensure that the third electrode sub-sections are not broken by the laser, the width w of the third shielding sub-section 1054 needs to be greater than 2u.

Specifically, the area where the first light shielding layer 105 is disposed depends on the arrangement of the sub-pixels. For example, the sub-pixel arrangement provided in the embodiments of the present application adopts a pentile design distribution. The plurality of first sub-pixels 1091 at least include red light-emitting pixels R, green light-emitting pixels G, and blue light-emitting pixels B. Likewise, the plurality of second sub-pixels 1092 at least include red light-emitting pixels R, green light-emitting pixels G, and blue light-emitting pixels B.

Further, the second light shielding layer 106 at least covers edge portions of the first shielding sub-section 1052, the second shielding sub-section 1053, and the third shielding sub-section 1054 surrounding the first opening 1051. In an embodiment, refer to FIG. 3 again, the second shielding layer 106 completely covers the first shielding sub-section 1052, the second shielding sub-section 1053, and the third shielding sub-section 1054. In another embodiment, refer to FIG. 5, which is a schematic diagram of a third cross-sectional structure of the display panel provided by the embodiment of the present application. The difference between FIG. 5 and FIG. 3 is that the second light shielding layer 106 covers the edge portions of the first shielding sub-section 1052, the second shielding sub-section 1053, and the third shielding sub-section 1054 surrounding the first opening 1051.

Figure 5:
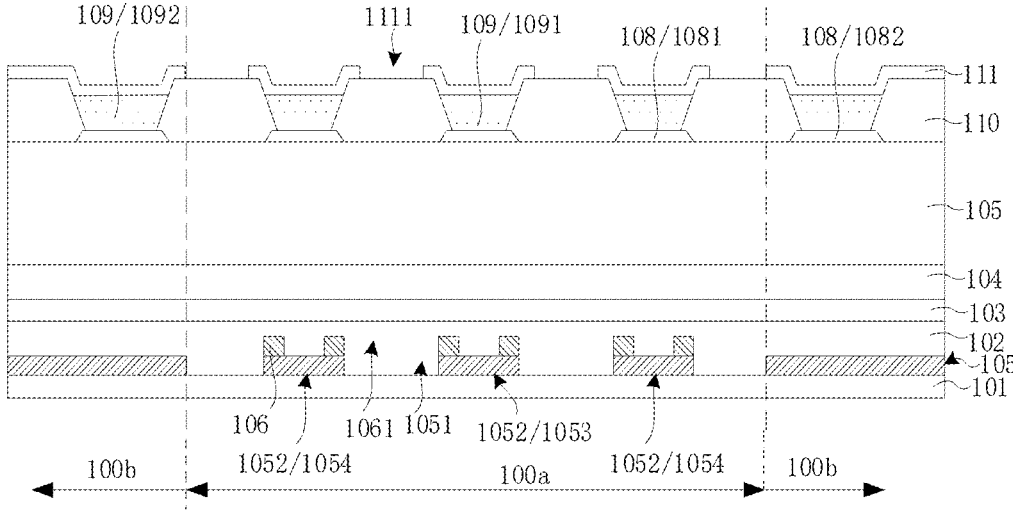
FIG. 5 is a schematic diagram of a third cross-sectional structure of a display panel provided by an embodiment of the present application.

In an embodiment, continue to refer to FIG. 3 and FIG. 5, at least in the first display area 100a, a surface of the second light shielding layer 106 close to the side of the first substrate 101 is in direct contact with the surface of the first light shielding layer 105 away from the side of the first substrate 101. Specifically, in order to ensure that the first light shielding layer 105 has a blocking light-shielding effect, the thickness of the first light shielding layer 105 ranges from 500 angstroms to 5000 angstroms, and the total thickness of the first light shielding layer 105 and the second light shielding layer 106 ranges from 1000 angstroms to 7500 angstroms.

Figure 6:
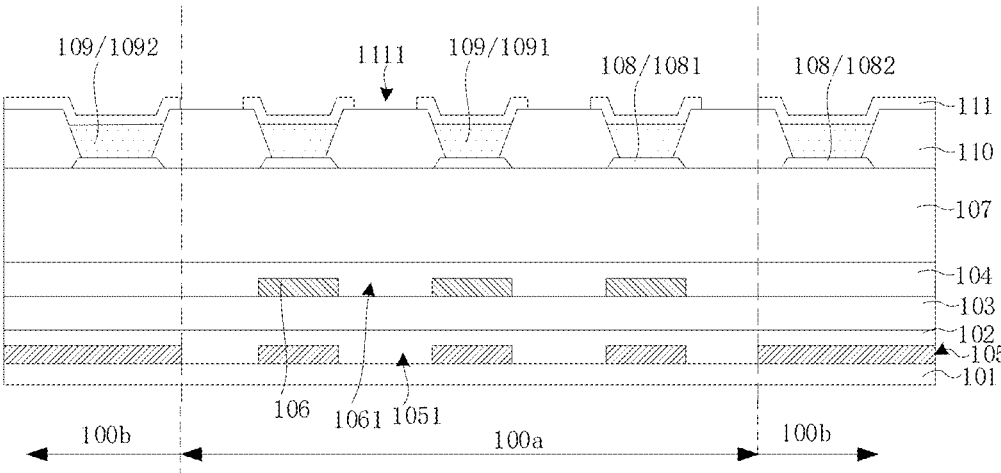
FIG. 6 is a schematic diagram of a fourth cross-sectional structure of a display panel provided by an embodiment of the present application.

In another embodiment, refer to FIG. 6, which is a schematic diagram of a fourth cross-sectional structure of the display panel provided by the embodiment of the present application. The difference between FIG. 6 and FIG. 3 is that in the first display area 100a, the surface of the second light shielding layer 106 close to the side of the first substrate 101 is not in direct contact with the surface of the first light shielding layer 105 away from the side of the first substrate 101. Specifically, the first light shielding layer 105 and the second light shielding layer 106 are provided in different layers. The display panel further includes a first inorganic insulating layer 102 and a driving circuit layer 107. The first inorganic insulating layer 102 is disposed between the first light shielding layer 105 and the second light shielding layer 106. The driving circuit layer 107 is disposed between the second light shielding layer 106 and the first electrode layer 108.

Further, the display panel further includes a second substrate 103 and a second inorganic insulating layer 104. The first light shielding layer 105 is disposed on one side of the first substrate 101. The first inorganic insulating layer 102 is disposed between the second substrate 103 and the first light shielding layer 105. The second light shielding layer 106 is disposed on the side of the second substrate 103 away from the first substrate 101. The second inorganic insulating layer 104 is disposed between the second light shielding layer 106 and the driving circuit layer 107.

The display panel further includes a pixel definition layer 110. The pixel definition layer 110 covers the first substrate 101 and the first electrode layer 108. The pixel definition layer 110 defines a plurality of pixel openings. The light emitting layer 109 is disposed in the pixel opening. The driving circuit layer 107 includes a plurality of pixel driving circuits for driving the light emitting layer 109 to emit light. Each of the pixel driving circuits includes a plurality of thin film transistors.

It should be noted that, in the embodiment of the present application, both the first display area 100a and the second display area 100b are provided with the first light shielding layer 105. The first light shielding layer 105 is disposed on the entire surface of the second display area 100b. The first light shielding layer 105 is patterned to form a plurality of the first openings 1051 in the first display area 100a. On the one hand, the first light shielding layer 105 can block laser from being irradiated to the second electrode layer 111 and the thin film transistor of the pixel area 1001a. This can prevent laser damage to the pixel driving circuit. On the other hand, because the first light shielding layer 105 is disposed between the first substrate 101 and the driving circuit layer 107, the facing area between the two is reduced, and therefore, an electrostatic interaction between the two can be reduced.

Figures 7, 8:
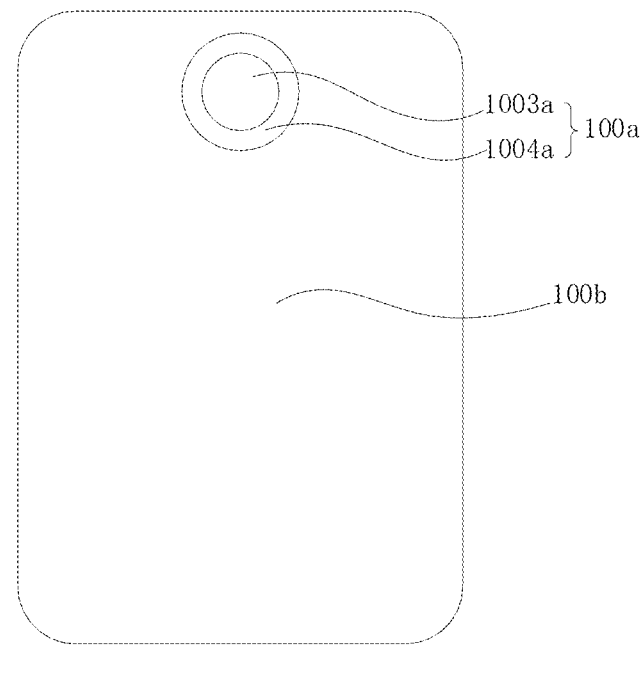
FIG. 7 is a schematic diagram of a second top-view structure of a display panel provided by an embodiment of the present application.
FIG. 8 is a schematic diagram of a fifth cross-sectional structure of a display panel provided by an embodiment of the present application.
Figure 9:
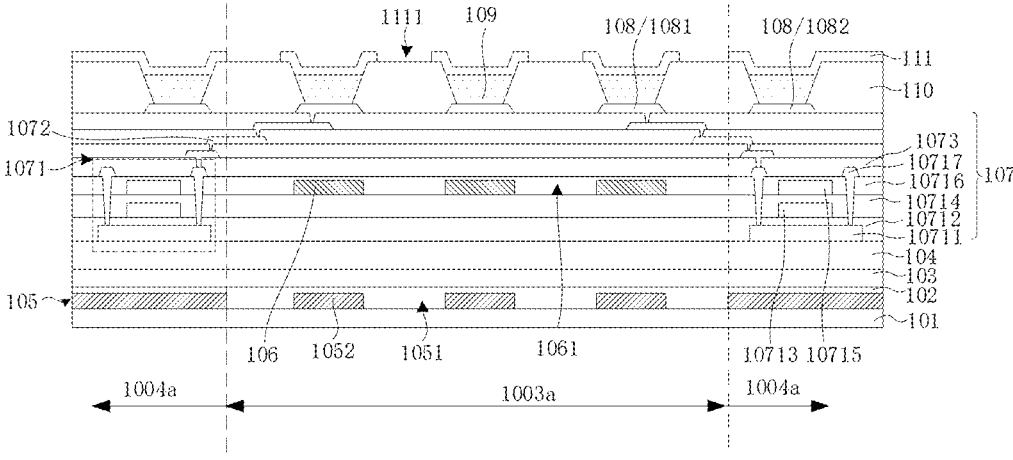
FIG. 9 is a schematic diagram of a sixth cross-sectional structure of a display panel provided by an embodiment of the present application.
Figure 10:
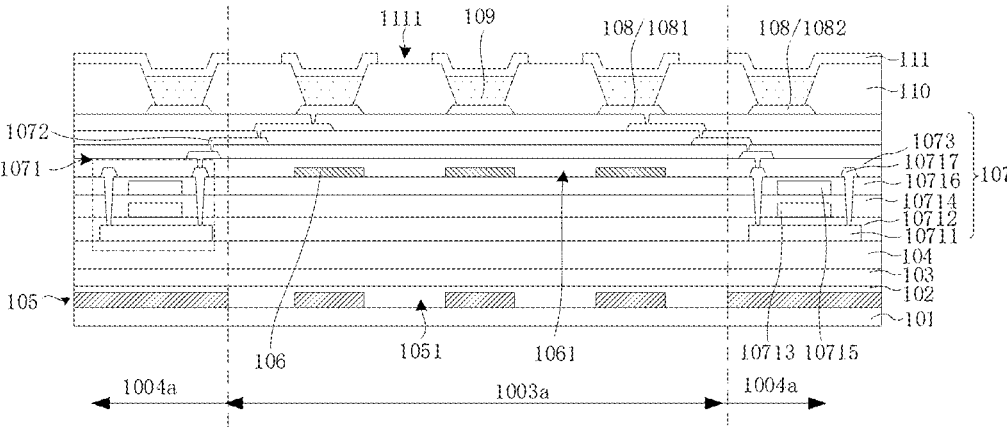
FIG. 10 is a schematic diagram of a seventh cross-sectional structure of a display panel provided by an embodiment of the present application.

Further, in order to improve the light transmittance of the first display area 100a, the display panel may be a camera under panel (CUP) display panel. Specifically, refer to FIG. 7 to FIG. 10, FIG. 7 is a schematic diagram of a second top-view structure of a display panel provided by an embodiment of the present application. FIG. 8 is a schematic diagram of a fifth cross-sectional structure of a display panel provided by an embodiment of the present application. FIG. 9 is a schematic diagram of a sixth cross-sectional structure of a display panel provided by an embodiment of the present application. FIG. 10 is a schematic diagram of a seventh cross-sectional structure of a display panel provided by an embodiment of the present application. The first display area 100a includes a display light transmitting area 1003a and a display transition area 1004a. The display transition area 1004a is disposed between the display light transmitting area 1003a and the second display area 100b. The driving circuit layer 107 includes a plurality of first pixel driving circuits 1071 disposed in the display transition area 1004a. The first pixel driving circuit 1071 is electrically connected to the corresponding first electrode 1081 through the transparent conductive layer 1072. It can be understood that, in the embodiment of the present application, the first pixel driving circuit 1071 that drives the light emitting layer 109 of the first display area 100a to emit light is placed in the display transition area 1004a. This can greatly improve the light transmittance of the first display area 100a.

Specifically, the transparent conductive layer 1072 includes a plurality of transparent wirings. The first pixel driving circuit 1071 is electrically connected to the first electrode 1081 through the transparent wiring. Optionally, the material of the transparent wiring is indium tin oxide.

Further, the display panel further includes a second pixel driving circuit (not shown in the figure) disposed in the display transition area 1004a and a plurality of second electrodes 1082. The second pixel driving circuit and the corresponding second electrode 1082 are electrically connected to drive the light emitting layer 109 of the display transition area 1004a to emit light. The display panel further includes a third pixel driving circuit and a plurality of third anodes disposed in the second display area 100b. The third pixel driving circuit and the corresponding third anode are electrically connected to drive the light emitting layer 109 of the second display area 100b to emit light.

It should be noted that the second light shielding layer 106 is only disposed in the first display area 100a. The first light shielding layer 105 is disposed in the first display area 100a and the second display area 100b. The entire surface of the first light shielding layer 105 is disposed in the second display area 100b, which can reduce the electrostatic interaction among the first substrate 101, the second pixel driving circuit, and the third pixel driving circuit. Therefore, the second light shielding layer 106 does not need to be provided in the second display area 100b. In this case, the second light shielding layer 106 does not need to be disposed in the film layer between the base substrates. The second light shielding layer 106 is disposed in the same layer as the film layer in the first pixel driving circuit 1071 and is located in the first display area 100a.

Specifically, the first pixel driving circuit 1071 includes a stacked semiconductor layer 10711, a first gate insulating layer 10712, a first gate metal layer 10713, a second gate insulating layer 10714, a second gate metal layer 10715, an interlayer dielectric layer 10716, and a source and drain metal layer 10717. A planarization layer 1073 is disposed between the driving circuit layer 107 and the pixel definition layer 110. The second light shielding layer 106 is disposed in the same layer as any one of the first gate metal layer 10713, the second gate metal layer 10715, and the source and drain metal layers 10717. In an embodiment, as shown in FIG. 8, the second light shielding layer 106 and the first gate metal layer 10713 are disposed in the same layer. As shown in FIG. 9, the difference between FIG. 9 and FIG. 8 is that the second light shielding layer 106 and the second gate metal layer 10715 are disposed in the same layer. As shown in FIG. 10, the difference between FIG. 10 and FIG. 8 is that the second light shielding layer 106 and the source and drain metal layer 10717 are disposed in the same layer.

In the embodiment of the present application, the pixel density of the first display area 100*a* is equal to the pixel density of the second display area 100*b*, so as to ensure that the display performance of the first display area 100*a* is the same as the display performance of the second display area 100*b*. This can improve the light transmittance of the first display area 100*a* on the premise of ensuring the overall display performance of the display panel.

Embodiments of the present application also provide a display device. The display device includes the display panel and the photosensor in the above embodiments. The photosensor is disposed on one side of the display panel and in the first display area 100*a*. Specifically, the photosensor includes a fingerprint recognition sensor, a camera, a structured light sensor, a time-of-flight sensor, a distance sensor, a light sensor, and the like. This enables the sensor to collect signals through the display light transmitting area 1002*a*, thereby enabling the display device to implement sensing under panel solutions such as fingerprint recognition under panel, camera under panel, face recognition under panel, distance sensing under panel, and the like.

Further, the display device further includes a touch panel. The touch panel is combined with the display panel in a built-in or externally mounted manner, so that the display device has a touch function.

The display device includes fixed terminals such as televisions and desktop computers, mobile terminals such as mobile phones and notebook computers, and wearable devices such as wristbands, VR (virtual display) devices, and AR (augmented display) devices.

Advantageous effects are as follows: In the display panel and the display device provided by the present application, the display panel includes a first display area and a second display area. A second light shielding layer is disposed on the basis of the first light shielding layer, the second light shielding layer is disposed on the side of the first light shielding layer away from the first substrate, and the second electrode layer is at least partially adjacent to the first light shielding layer in the first display area. Light transmitting openings are arranged between sub-pixels. The first light shielding layer is provided with a first opening in the first display area corresponding to the light transmitting opening, and the second light shielding layer is provided with a second opening in the first display area corresponding to the light transmitting opening. The arrangement of the second light shielding layer is equivalent to increasing the overall thickness of the light shielding layer, so that the area of the second electrode layer when diffracted light formed by an infrared laser at the second opening is irradiated to the second electrode layer is reduced. This avoids that a part of the second electrode layer corresponding to the first sub-pixels is also removed by laser, which is beneficial to improve a precision of laser and a light transmittance of the first display area.

To sum up, although the present application has disclosed the above-mentioned preferred embodiments, the above-mentioned preferred embodiments are not intended to limit the present application. Those skilled in the art can make various changes and modifications without departing from the spirit and scope of the present application. Therefore, the protection scope of the present application is subject to the scope defined by the claims.

What is claimed is:

1. A display panel comprising a first display area and a second display area, wherein a light transmittance of the first display area is greater than a light transmittance of the second display area, the display panel comprises:

a first substrate;

a first light shielding layer disposed on a side of the first substrate, the first light shielding layer being provided in the first display area and the second display area;

a second light shielding layer disposed on a side of the first light shielding layer away from the first substrate, the second light shielding layer being provided in the first display area but absent from the second display area, wherein a thickness of a light shielding layer formed by superposition of the first light shielding layer and the second light shielding layer in the first display area is greater than a thickness of the first light shielding layer in the second display area;

a first electrode layer disposed on a side of the second light shielding layer away from the first substrate;

a light emitting layer disposed on a side of the first electrode layer away from the first substrate, wherein the light emitting layer comprises a plurality of first sub-pixels disposed in the first display area and a plurality of second sub-pixels disposed in the second display area; and a second electrode layer disposed on a side of the light emitting layer away from the first substrate, wherein the second electrode layer is provided with a light transmitting opening between at least part of adjacent ones of the first sub-pixels in the first display area;

wherein the first light shielding layer is provided with a first opening corresponding to the light transmitting opening in the first display area, and the second light shielding layer is provided with a second opening corresponding to the light transmitting opening in the first display area;

wherein the first light shielding layer comprises:

first shielding sub-sections corresponding to the first sub-pixels;

a third shielding sub-section disposed around the first shielding sub-sections;

second shielding sub-sections each connecting two adjacent ones of the first shielding sub-sections or connecting adjacent ones of the first shielding sub-sections and the third shielding sub-section;

wherein each of the first shielding sub-sections is in shape of a closed graph, and the first shielding sub-sections are indirectly connected to each other; the second shielding sub-sections are serpentine traces;

wherein an orthographic projection of the first opening on the first substrate is located within an orthographic projection of the light transmitting opening on the first substrate; and an orthographic projection of the second opening on the first substrate is located within the orthographic projection of the light transmitting opening on the first substrate;

wherein a planar area of the first opening is smaller than that of the light transmitting opening, and a planar area of the second opening is smaller than that of the light transmitting opening;

wherein the first electrode layer comprises a plurality of first electrodes located in the first display area, and an orthographic projection of each first shielding sub-section on the first substrate covers an orthographic projection of a corresponding first electrode of the first electrodes on the first substrate; and wherein the second light shielding layer covers edge portions of the first shielding sub-sections, the second shielding sub-sections, and the third shielding sub-section that surround the first opening.

2. The display panel of claim 1, wherein the first opening is provided in the first light shielding layer and in the first display area, the first opening being surrounded by the adjacent ones of the first shielding sub-sections and the second shielding sub-sections and/or surrounded by the adjacent ones of the first shielding sub-sections, the second shielding sub-sections, and the third shielding sub-section.

3. The display panel of claim 2, wherein a distance between an orthographic projection of one of the first shielding sub-sections on the first substrate and an orthographic projection of the first electrode layer on the first substrate ranges from 0.5 micrometers to 1.5 micrometers.

4. The display panel of claim 2, wherein the first display area comprises a display light transmitting area and a display transition area disposed between the display light transmitting area and the second display area, and the third shielding sub-section is disposed corresponding to an edge of the display light transmitting area.

5. The display panel of claim 4, wherein the display panel further comprises:

a driving circuit layer disposed between the first light shielding layer and the first electrode layer, wherein the driving circuit layer comprises:

a semiconductor layer, a first insulating layer disposed on a side of the semiconductor layer away from the first substrate;

a first gate metal layer disposed on a side of the first insulating layer away from the first substrate;

a second insulating layer disposed on a side of the first gate metal layer away from the first substrate;

a second gate metal layer disposed on a side of the second insulating layer away from the first substrate;

a third insulating layer disposed on a side of the second gate metal layer away from the first substrate; and a source and drain metal layer disposed on a side of the third insulating layer away from the first substrate;

wherein the second light shielding layer and the first gate metal layer are disposed in a same layer, the second light shielding layer and the second gate metal layer are disposed in a same layer, or the second light shielding layer and the source and drain metal layer are disposed in a same layer.

6. A display panel comprising a first display area and a second display area, wherein the display panel comprises:

a first substrate;

a first light shielding layer disposed on a side of the first substrate, the first light shielding layer being provided in the first display area and the second display area;

a second light shielding layer disposed on a side of the first light shielding layer away from the first substrate, the second light shielding layer being provided in the first display area but absent from the second display area, wherein a thickness of a light shielding layer formed by superposition of the first light shielding layer and the second light shielding layer in the first display area is greater than a thickness of the first light shielding layer in the second display area;

a first electrode layer disposed on a side of the second light shielding layer away from the first substrate;

a light emitting layer disposed on a side of the first electrode layer away from the first substrate, wherein the light emitting layer comprises a plurality of first sub-pixels disposed in the first display area and a plurality of second sub-pixels disposed in the second display area; and a second electrode layer disposed on a side of the light emitting layer away from the first substrate, wherein the second electrode layer is provided with a light transmitting opening between at least part of adjacent ones of the first sub-pixels in the first display area;

wherein the first light shielding layer is provided with a first opening corresponding to the light transmitting opening in the first display area, and the second light shielding layer is provided with a second opening corresponding to the light transmitting opening in the first display area;

wherein the first light shielding layer comprises:

first shielding sub-sections corresponding to the first sub-pixels;

a third shielding sub-section disposed around the first shielding sub-sections;

second shielding sub-sections each connecting two adjacent ones of the first shielding sub-sections or connecting adjacent ones of the first shielding sub-sections and the third shielding sub-section;

wherein each of the first shielding sub-sections is in shape of a closed graph, and the first shielding sub-sections are indirectly connected to each other; the second shielding sub-sections are serpentine traces;

wherein an orthographic projection of the first opening on the first substrate is located within an orthographic projection of the light transmitting opening on the first substrate; and an orthographic projection of the second opening on the first substrate is located within the orthographic projection of the light transmitting opening on the first substrate;

wherein a planar area of the first opening is smaller than that of the light transmitting opening, and a planar area of the second opening is smaller than that of the light transmitting opening;

wherein the first electrode layer comprises a plurality of first electrodes located in the first display area, and an orthographic projection of each first shielding sub-section on the first substrate covers an orthographic projection of a corresponding first electrode of the first electrodes on the first substrate; and wherein the second light shielding layer covers edge portions of the first shielding sub-sections, the second shielding sub-sections, and the third shielding sub-section that surround the first opening.

7. The display panel of claim 6, wherein the first opening is provided in the first light shielding layer and in the first display area, the first opening being surrounded by the adjacent ones of the first shielding sub-sections and the second shielding sub-sections and/or surrounded by the adjacent ones of the first shielding sub-sections, the second shielding sub-sections, and the third shielding sub-section.

8. The display panel of claim 7, wherein a distance between an orthographic projection of one of the first shielding sub-sections on the first substrate and an orthographic projection of the first electrode layer on the first substrate ranges from 0.5 micrometers to 1.5 micrometers.

9. The display panel of claim 7, wherein the first display area comprises a display light transmitting area and a display transition area disposed between the display light transmitting area and the second display area, and the third shielding sub-section is disposed corresponding to an edge of the display light transmitting area.

10. The display panel of claim 9, wherein the display panel further comprises:

a driving circuit layer disposed between the first light shielding layer and the first electrode layer, wherein the driving circuit layer comprises:

a semiconductor layer, a first insulating layer disposed on a side of the semiconductor layer away from the first substrate;

a first gate metal layer disposed on a side of the first insulating layer away from the first substrate;

a second insulating layer disposed on a side of the first gate metal layer away from the first substrate;

a second gate metal layer disposed on a side of the second insulating layer away from the first substrate;

a third insulating layer disposed on a side of the second gate metal layer away from the first substrate; and a source and drain metal layer disposed on a side of the third insulating layer away from the first substrate;

wherein the second light shielding layer and the first gate metal layer are disposed in a same layer, the second light shielding layer and the second gate metal layer are disposed in a same layer, or the second light shielding layer and the source and drain metal layer are disposed in a same layer.

11. The display panel of claim 6, wherein at least in the first display area, a surface of the second light shielding layer close to a side of the first substrate is in direct contact with a surface of the first light shielding layer away from the side of the first substrate.

12. The display panel of claim 11, wherein a thickness of the first light shielding layer ranges from 500 angstroms to 5000 angstroms, and a total thickness of the first light shielding layer and the second light shielding layer ranges from 1000 angstroms to 7500 angstroms.

13. The display panel of claim 6, wherein the display panel further comprises:

a first inorganic insulating layer disposed between the first light shielding layer and the second light shielding layer; and a driving circuit layer disposed between the second light shielding layer and the first electrode layer.

14. The display panel of claim 13, wherein the display panel further comprises a second substrate and a second inorganic insulating layer;

wherein the first light shielding layer is disposed on a side of the first substrate; the first inorganic insulating layer is disposed between the second substrate and the first light shielding layer; the second light shielding layer is disposed on a side of the second substrate away from the first substrate; and the second inorganic insulating layer is disposed between the second light shielding layer and the driving circuit layer.

15. The display panel of claim 6, wherein a pixel density of the first display area is equal to a pixel density of the second display area.

16. A display device, comprising:

a display panel; and a photosensor disposed on a side of the display panel and located in a first display area;

wherein the display panel comprises the first display area and a second display area, and the display panel comprises:

a first substrate;

a first light shielding layer disposed on a side of the first substrate, the first light shielding layer being provided in the first display area and the second display area;

a second light shielding layer disposed on a side of the first light shielding layer away from the first substrate, the second light shielding layer being provided in the first display area but absent from the second display area, wherein a thickness of a light shielding layer formed by superposition of the first light shielding layer and the second light shielding layer in the first display area is greater than a thickness of the first light shielding layer in the second display area;

a first electrode layer disposed on a side of the second light shielding layer away from the first substrate;

a light emitting layer disposed on a side of the first electrode layer away from the first substrate, wherein the light emitting layer comprises a plurality of first sub-pixels disposed in the first display area and a plurality of second sub-pixels disposed in the second display area; and a second electrode layer disposed on a side of the light emitting layer away from the first substrate, wherein the second electrode layer is provided with a light transmitting opening between at least part of adjacent ones of the first sub-pixels in the first display area;

wherein the first light shielding layer is provided with a first opening corresponding to the light transmitting opening in the first display area, and the second light shielding layer is provided with a second opening corresponding to the light transmitting opening in the first display area;

wherein the first light shielding layer comprises:

first shielding sub-sections corresponding to the first sub-pixels;

a third shielding sub-section disposed around the first shielding sub-sections;

second shielding sub-sections each connecting two adjacent ones of the first shielding sub-sections or connecting adjacent ones of the first shielding sub-sections and the third shielding sub-section;

wherein each of the first shielding sub-sections is in shape of a closed graph, and the first shielding sub-sections are indirectly connected to each other; the second shielding sub-sections are serpentine traces;

wherein an orthographic projection of the first opening on the first substrate is located within an orthographic projection of the light transmitting opening on the first substrate; and an orthographic projection of the second opening on the first substrate is located within the orthographic projection of the light transmitting opening on the first substrate;

wherein a planar area of the first opening is smaller than that of the light transmitting opening, and a planar area of the second opening is smaller than that of the light transmitting opening;

wherein the first electrode layer comprises a plurality of first electrodes located in the first display area, and an orthographic projection of each first shielding sub-section on the first substrate covers an orthographic projection of a corresponding first electrode of the first electrodes on the first substrate; and wherein the second light shielding layer covers edge portions of the first shielding sub-sections, the second shielding sub-sections, and the third shielding sub-section that surround the first opening.

* * * * *